(12) United States Patent
Sterk

(10) Patent No.: US 6,448,105 B1
(45) Date of Patent: Sep. 10, 2002

(54) METHOD FOR DOPING ONE SIDE OF A SEMICONDUCTOR BODY

(75) Inventor: Steffen Sterk, Munich (DE)

(73) Assignee: Siemens and Shell Solar GmbH (NL)

( * ) Notice: Subject to any disclaimer, the term of this patent is extended or adjusted under 35 U.S.C. 154(b) by 0 days.

(21) Appl. No.: 09/647,046

(22) PCT Filed: Mar. 25, 1999

(86) PCT No.: PCT/EP99/02038

§ 371 (c)(1),
(2), (4) Date: Nov. 22, 2000

(87) PCT Pub. No.: WO99/49521

PCT Pub. Date: Sep. 30, 1999

(30) Foreign Application Priority Data

Mar. 25, 1998 (DE) .......................................... 198 13 188

(51) Int. Cl.⁷ .............................................. H01L 21/00
(52) U.S. Cl. .......................... 438/97; 438/559; 438/563; 438/923
(58) Field of Search ............................... 438/96, 97, 98, 438/558, 559, 563, 923

(56) References Cited

U.S. PATENT DOCUMENTS 5,899,704 A * 5/1999 Schlosser et al. ............. 438/98

FOREIGN PATENT DOCUMENTS

| JP | J80002727 | * | 1/1980 | |
| WO | WO 91 19323 A | | 12/1991 | ........... H01L/31/06 |
| WO | WO 96 28851 A | | 9/1996 | ........... H01L/31/18 |
| WO | WO 97 04480 A | | 2/1997 | ......... H01L/21/225 |

OTHER PUBLICATIONS

V. N. Sarma, "Diffusion of Arsenic Into Silicon from a Solid Phase," IBM Technical Disclosure Bulletin, pp. 1257–1258, vol. 19, No. 4, Sep. 1976.
Mathiot, D. et al., "Boron diffusion through thin gate oxides: Influence of nitridation and effect on the $Si/SiO_2$ interface electrical characteristics," pp. 8215–8220, J. Appl. Phys., Jun. 15, 1993, vol. 73, No. 12.
Sen, S., "Spin–on doping of porous silicon and its effect on photoluminescence and transport characteristics," pp. 2253–2255, Appl. Phys. Lett, Apr. 28, 1997, vol. 70, No. 17.
Ingolf Ruge, "Halbletier–Technologie," Springer–Verlage, Berlin, Heidelberg, New York 1975.
Patent Abstracts of Japan, vol. 010, No. 306, Oct. 17, 1986 & JP 61 121326 A (OKI Electric Ind Co Ltd), Jun. 9, 1986.
Patent Abstracts of Japan, vol. 013, No. 023, Jan. 19, 1989 & JP 63 226920 A (NIPPON TELEGR & TELEPH Corp), Sep. 21, 1988.
Krygowski, T. et al: "A Simultaneously Diffused, Textured, In Situ Oxide AR–Coated Solar Cell Process (STAR Process) for High–Efficiency Silicon Solar Cells", IEEE Transactions on Electron Devices, vol. 45, No. 1, Jan. 1, 1998, pp. 194–199.

* cited by examiner

Primary Examiner—Chandra Chaudhari
(74) Attorney, Agent, or Firm—Wolf, Greenfield & Sacks, P.C.

(57) ABSTRACT

A method for doping one side of a semiconductor substrate, such as in a silicon wafer, wherein an oxide layer is deposited on both the side to be doped and the non-doped side of the semiconductor substrate. A doping layer, containing a doping agent, is deposited onto the oxide layer on the side to be doped. The doping agent passes through the oxide layer on the side to be doped and into the semiconductor substrate. The oxide layer on the non-doped side serves as a protective layer, preventing diffusion of the doping agent into the undoped side of the substrate.

7 Claims, 1 Drawing Sheet

METHOD FOR DOPING ONE SIDE OF A SEMICONDUCTOR BODY

BACKGROUND OF THE INVENTION

Figure 1:
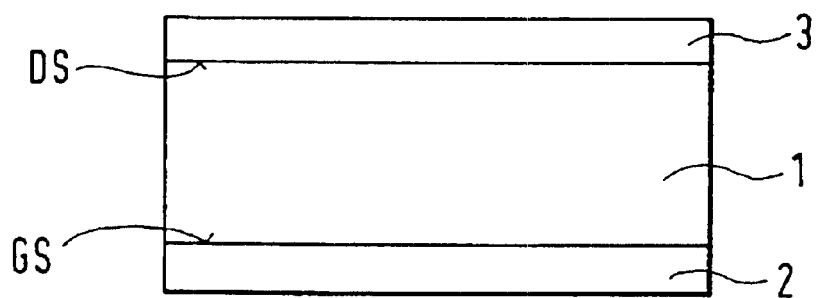

The present invention relates to a method for doping one side of a semiconductor body, especially for doping one side of silicon wafers.

In the production of semiconductor structural elements, a targeted doping of the substrate or of a semiconductor layer is necessary in order to provide for the desired conductive properties. For some applications it is advantageous to perform doping on one side, i.e. to introduce the doping substance by diffusion into the body that is to be doped from one side only while protecting the other side from unintended doping.

A method of this sort is required for example in the production of solar cells having what is called a back-surface field. In this case, a highly doped layer is deposited on the back side of the solar cell in order to generate a field to counter the diffusion of minor charge carriers (back-surface field).

A known method for doping of one side, as described for example in PCT application WO96/28851, provides that first a protective layer (e.g. a protective lacquer) be deposited on the side of semiconductor body that is not to be doped, or that a thermal oxide is grown on both sides that subsequently is removed by etching one side. Then, the unprotected side of the semiconductor body may be doped for example out of the gaseous phase inside a diffusion oven. A doping layer can also be applied to the side to be doped, which is not covered by a protective cover. The doping agent contained in the doping lacquer then diffuses within one temperature step. After the diffusion process, the protective layer is removed by etching.

One possibility to enable doping on one side of a semiconductor body is to apply to both sides a protective layer, for example by thermally oxidizing the semiconductor body and then separating from one side the protective film disposed on the side of the semiconductor body that is to be doped. This side can then also be doped out of the gaseous phase within a diffusion oven, as described above, or a doping layer (e.g. doping lacquer or doping paste) may be applied to the side of the semiconductor body that is to be doped and may be diffused thereinto by a subsequent temperature treatment. After the diffusion step, again the protective layer is removed by etching.

In order to achieve regular, uniform properties and a reliable functioning of semiconductor structural elements produced in this manner, uniform homogenous doping is necessary. One tear formation or a bursting off of the doping lacquer that has been applied and dried or any damage to the doping agent will negatively affect the functioning and reliability of the structural element.

BRIEF SUMMARY OF THE INVENTION

The present invention therefore pursues the object of making available a method for doping of one side of a semiconductor body, especially of a silicon wafer, enabling a reliable homogenous doping of the desired side while simultaneously reliably protecting the side that is not to be doped.

The object is solved according to the present invention by the method described in claim 1. Advantageous embodiments of the invention are derived from the subclaims.

A central thought here is that the doping agent contained within the doping layer passes through a conventional oxide layer during the diffusion process and diffuses into the side to be doped, where the oxide layer simultaneously serves as a protective coat on the side that is not to be doped and prevents penetration of doping agent on this side.

By applying doping lacquer onto an oxide layer that has been deposited beforehand, a better lateral distribution of the doping agent is achieved and a "doping through" the oxide layer positively supports a homogenous doping.

In addition, the inventive method also provides the advantage that in the case of a non-homogenous spreading of doping agent upon treatment or coating, especially on rough surfaces (e.g. with textured solar cells), homogenous doping is also guaranteed.

In the following, the invention is described using individual method steps and with reference to the attached diagrams.

BRIEF DESCRIPTION OF THE SEVERAL VIEWS OF THE DRAWING(S)

Figure 2:
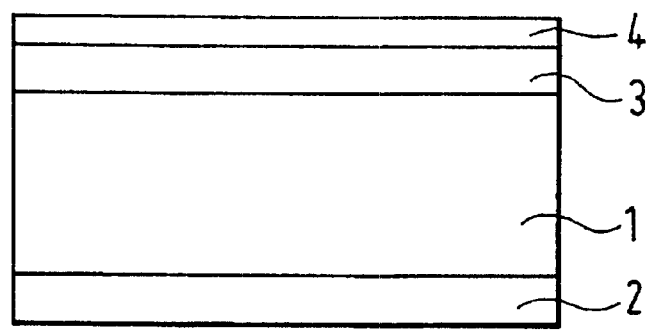
Figure 3:
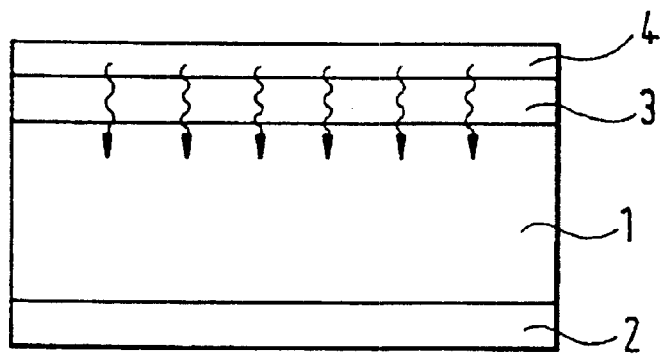

FIGS. 1 through 3 show the individual steps of the inventive method for doping of one side, using cross sectional views of a semiconductor structure.

The semiconductor substrate (1) shown in FIG. 1 comprises a side to be doped (DS) and an opposite side (GS) that is not to be doped. On both sides of the substrate (1), an oxide layer (2, 3) is applied in a first step of the method. Preferably, this oxide layer is thermally grown. For this purpose, the substrate (1) is heated in an oven in an oxygenated atmosphere to a temperature of between 950° C. and 1050° C. so that an oxide layer is formed on the surfaces DS and GS of the substrate. Following this, in a second step of the method, a doping coat (4) having a high concentration of doping agent is deposited onto the oxide layer (3) that is located on the side of the semiconductor substrate (1) that is to be doped. This is illustrated in FIG. 2. The doping layer (4) is applied for example as a doping lacquer via spin-on or as a doping paste by pressing it onto the surface. The doping layer may however also be applied by brush or one-sided CVD deposit of doping oxide. Prior to the actual diffusion process, the doping layer deposited as a liquid is dried. By depositing the doping layer (4) onto the oxide layer (3), a very good, homogenous or evenly lateral distribution of doping agent is achieved during the diffusion, which is necessary for a uniform doping.

The third step of the method, the actual diffusion process, is schematically represented in FIG. 3. The doping layer (4) typically contains boron as doping agent. Boron is driven out of the doping layer (4) while in an oven at temperatures between 900 and 1200° C., preferably in a temperature range of 1000 to 1100° C. The doping agent first diffuses out of the lateral homogenously-spread doping layer (4) and passes through the oxide layer (3) before it penetrates the substrate (1). Here, the oxide layer (3) located between the doping layer (4) and the substrate (1) acts not as a conventional protective layer, but rather as a layer supporting the diffusion process, sort of as a creep oxide which supports regular diffusing of the doping agent. On the other hand, volatile boron that during warming possibly gasses out into the atmosphere and thus also would arrive at the area of the substrate that is not to be doped, is absorbed by the oxide layer (2) formed on this side. On the side (GS) that is not to be doped, the deposited oxide layer (2) acts as a conventional protective layer and guarantees sufficient protection from unintended doping given the low supply of doping agent.

Here, the temperature of the diffusion process may be adjusted in certain ranges to the concentration of the doping agent within the doping layer, e.g. if various different doping agents are to be diffused.

After the diffusion process, both the diffusion layer (4) and also the oxide layers (2 and 3) are removed by quick submersion into the acid hydrogen fluoride.

DETAILED DESCRIPTION OF THE INVENTION

One example of an application for this method is for example the generation of what is called a back-surface field (BSF) on the back side of solar cells by doping boron on one side using a boron doping lacquer and subsequent diffusion, avoiding the disadvantageous boron doping of front-side solar cells. The method according to the invention, however, is not limited to the production of such solar cells, but can also be used for coating other semiconductor layers. The method according to the invention is characterized essentially by an improved homogeneous doping with simultaneous and reliable protection of the side that is not to be doped, that can be simply integrated into conventional production methods for solar cells.

What is claimed is:

1. A method for one-sided doping of a semiconductor substrate, especially a silicon wafer, comprising the steps:
   depositing an oxide layer both on a first side of the semiconductor substrate and on a second side of said semiconductor substrate, wherein the first side of the semiconductor substrate is to be doped and the second side of the semiconductor substrate is not to be doped,
   depositing a doping layer onto said oxide layer on the first side of said semiconductor substrate, and
   diffusing a doping agent contained in said doping layer into said semiconductor substrate such that said doping agent passes through said oxide layer located between said semiconductor substrate and said doping layer and such that said oxide layer deposited on the second side of said semiconductor substrate serves as a protective oxide and prevents diffusion of said doping agent into the second side of said semiconductor substrate.

2. The method according to claim 1, wherein the first side of said semiconductor substrate has a rough surface.

3. The method according to claim 1, wherein the step of depositing said oxide layer further comprises applying said oxide layer in an oxygenated atmosphere at a temperature in a range of 600 to 1200° C.

4. The method according to claim 1, wherein said doping layer is centrifuged, applied using a brush, and/or deposited using a CVD method.

5. The method according to claim 1, wherein the step of diffusing a dopant agent further comprises diffusing the dopant agent at a temperature between 900 and 1200° C.

6. The method according to claim 1, wherein the step of depositing a doping layer further comprises depositing a doping layer containing boron.

7. The method according to claim 1, wherein the first side of the semiconductor substrate comprises a back side of a solar cell; and
   wherein the step of diffusing a doping agent contained in said doping layer further comprises generating a back surface field of the solar cell.

* * * * *